(12) United States Patent
Kao et al.

(10) Patent No.: US 11,437,355 B2
(45) Date of Patent: Sep. 6, 2022

(54) LIGHT-EMITTING PACKAGE STRUCTURE AND MANUFACTURING METHOD THEREOF

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chien-Feng Kao, New Taipei (TW); Chen-Hsiu Lin, New Taipei (TW); Wen-Hsiang Lin, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/935,424

(22) Filed: Jul. 22, 2020

(65) Prior Publication Data

US 2021/0125973 A1   Apr. 29, 2021

(30) Foreign Application Priority Data

Oct. 28, 2019   (CN) .......................... 201911032149.7

(51) Int. Cl.
*H01L 29/20*  (2006.01)
*H01L 33/00*  (2010.01)
(Continued)

(52) U.S. Cl.
CPC ............ *H01L 25/165* (2013.01); *H01L 24/06* (2013.01); *H01L 24/08* (2013.01); *H01L 25/167* (2013.01);
(Continued)

(58) Field of Classification Search
CPC ..... H01L 25/165; H01L 25/167; H01L 24/06; H01L 24/08; H01L 33/62;
(Continued)

(56) References Cited

U.S. PATENT DOCUMENTS 10,516,081 B1 * 12/2019 Xin ........................ H01L 33/24
2019/0066571 A1 * 2/2019 Goward ............ H01L 23/49827
(Continued)

FOREIGN PATENT DOCUMENTS

TW          M386573 U1      8/2010
TW          M581770 U       8/2019

*Primary Examiner* — Ismail A Muse
(74) *Attorney, Agent, or Firm* — Li & Cai Intellectual Property (USA) Office

(57) ABSTRACT

A light-emitting package structure and a manufacturing method thereof are provided. The light-emitting package structure includes a driving device and at least one light-emitting chip. The driving device includes a driving chip and a redistribution layer structure formed over the driving chip. The driving chip has a first surface and a second surface opposite to the first surface. The redistribution layer structure includes a plurality of first conductive pads disposed on the first surface and a plurality of second conductive pads disposed on the second surface, and one of the first conductive pads is electrically connected to one of the second conductive pads. The at least one light-emitting chip is disposed on the first surface of the driving chip and electrically connected to the driving chip through the first conductive pads.

18 Claims, 10 Drawing Sheets

(51) Int. Cl.
    *H01L 25/16*     (2006.01)
    *H01L 23/00*     (2006.01)
    *H01L 33/62*     (2010.01)
    *H01L 33/56*     (2010.01)
    *H01L 33/60*     (2010.01)

(52) U.S. Cl.
    CPC .............. *H01L 33/62* (2013.01); *H01L 33/56* (2013.01); *H01L 33/60* (2013.01); *H01L 2224/02331* (2013.01); *H01L 2224/02371* (2013.01); *H01L 2224/02372* (2013.01); *H01L 2224/02377* (2013.01); *H01L 2224/02381* (2013.01); *H01L 2224/06182* (2013.01); *H01L 2224/08145* (2013.01); *H01L 2933/005* (2013.01); *H01L 2933/0058* (2013.01); *H01L 2933/0091* (2013.01)

(58) Field of Classification Search
    CPC ........... H01L 2224/08145; H01L 33/56; H01L 33/60; H01L 2933/005; H01L 2933/0091; H01L 2933/0058; H01L 2224/02331; H01L 2224/02372; H01L 2224/02381; H01L 2224/02377; H01L 2224/02371; H01L 2224/06182; H01L 33/48; H01L 33/54; H01L 2933/0033; H01L 2933/0066
See application file for complete search history.

(56) References Cited

U.S. PATENT DOCUMENTS

| | | | |
|---|---|---|---|
| 2019/0096864 A1* | 3/2019 | Huitema | H01L 24/25 |
| 2020/0075564 A1* | 3/2020 | Lin | H05K 3/284 |
| 2020/0161518 A1* | 5/2020 | Lin | H01L 33/52 |
| 2020/0266181 A1* | 8/2020 | Lin | H01L 24/83 |
| 2021/0057300 A1* | 2/2021 | You | H01L 24/19 |
| 2021/0257350 A1* | 8/2021 | Hu | H01L 24/25 |

* cited by examiner

LIGHT-EMITTING PACKAGE STRUCTURE AND MANUFACTURING METHOD THEREOF

CROSS-REFERENCE TO RELATED PATENT APPLICATION

This application claims the benefit of priority to China Patent Application No. 201911032149.7, filed on Oct. 28, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting package structure and a manufacturing method thereof, and more particularly to a substrate-free light-emitting package structure and a manufacturing method thereof.

BACKGROUND OF THE DISCLOSURE

In the current technology, a light-emitting diode package module usually includes a plurality of light-emitting chips for respectively generating red, blue, and green lights, and a driving chip that is electrically connected to the light-emitting chips. The driving chip controls the light-emitting chips to produce different color lights. In a conventional light-emitting diode package module, all of the light-emitting chips and the driving chip are disposed on a package substrate and connected to the corresponding pads on the package substrate to establish an electrical connection between each light-emitting chip and the driving chip. However, it is difficult for the conventional light-emitting diode package module having a wire-bonding structure and the package substrate to be further reduced in size, thus making it difficult to be developed toward being lightweight and compact, as is the current trend of electronic products.

SUMMARY OF THE DISCLOSURE

In response to the above-referenced technical inadequacies, the present disclosure provides a light-emitting package structure and a manufacturing method thereof to reduce the overall package size of the light-emitting package structure and conform to the aim of development toward a lightweight and compact design of electronic products.

In one aspect, the present disclosure provides a light-emitting package structure including a driving device and at least one light-emitting chip. The driving device includes a drive chip and a redistribution layer structure formed over the drive chip. The drive chip has a first surface and a second surface opposite to the first surface. The redistribution layer structure includes a plurality of first conductive pads disposed on the first surface and a plurality of second conductive pads disposed on the second surface, and one of the first conductive pads is electrically connected to one of the second conductive pads. The at least one light-emitting chip is disposed over the first surface of the drive chip and electrically connected to the drive chip through the first conductive pads.

In another aspect, the present disclosure provides a manufacturing method of a light-emitting package structure. The manufacturing method includes: forming at least one driving device, in which the at least one driving device includes a drive chip and a redistribution layer structure formed over the drive chip, the drive chip has a first surface and a second surface opposite to the first surface, the redistribution layer structure includes a plurality of first conductive pads disposed on the first surface and a plurality of second conductive pads disposed on the second surface, and at least one of the first conductive pads is electrically connected to one of the second conductive pads; disposing at least one light-emitting chip over the first surface of the drive chip, in which the at least one light-emitting chip is electrically connected to the drive chip through the first conductive pads; forming a package body to surround the at least one light-emitting chip and the at least one driving device; and performing a cutting process on the package body to form the light-emitting package structure that includes the at least one light-emitting chip and the at least one driving device.

Therefore, one of the advantages of the present disclosure, in a light-emitting package structure and a manufacturing method thereof provided in the present disclosure, by technical features of "the driving device including the drive chip and the redistribution layer structure formed over the drive chip, in which the redistribution layer structure includes a plurality of first conductive pads disposed on the first surface and a plurality of second conductive pads disposed on the second surface, and at least one of the first conductive pads is electrically connected to one of the second conductive pads," and "the at least one light-emitting chip being disposed over the first surface of the drive chip and electrically connected to the drive chip through the first conductive pads," the light-emitting package structure without a package substrate or a bonding wire can be formed, so that the overall packaged size of the light-emitting package structure can be further reduced and a light-emitting efficiency of the light-emitting package structure can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
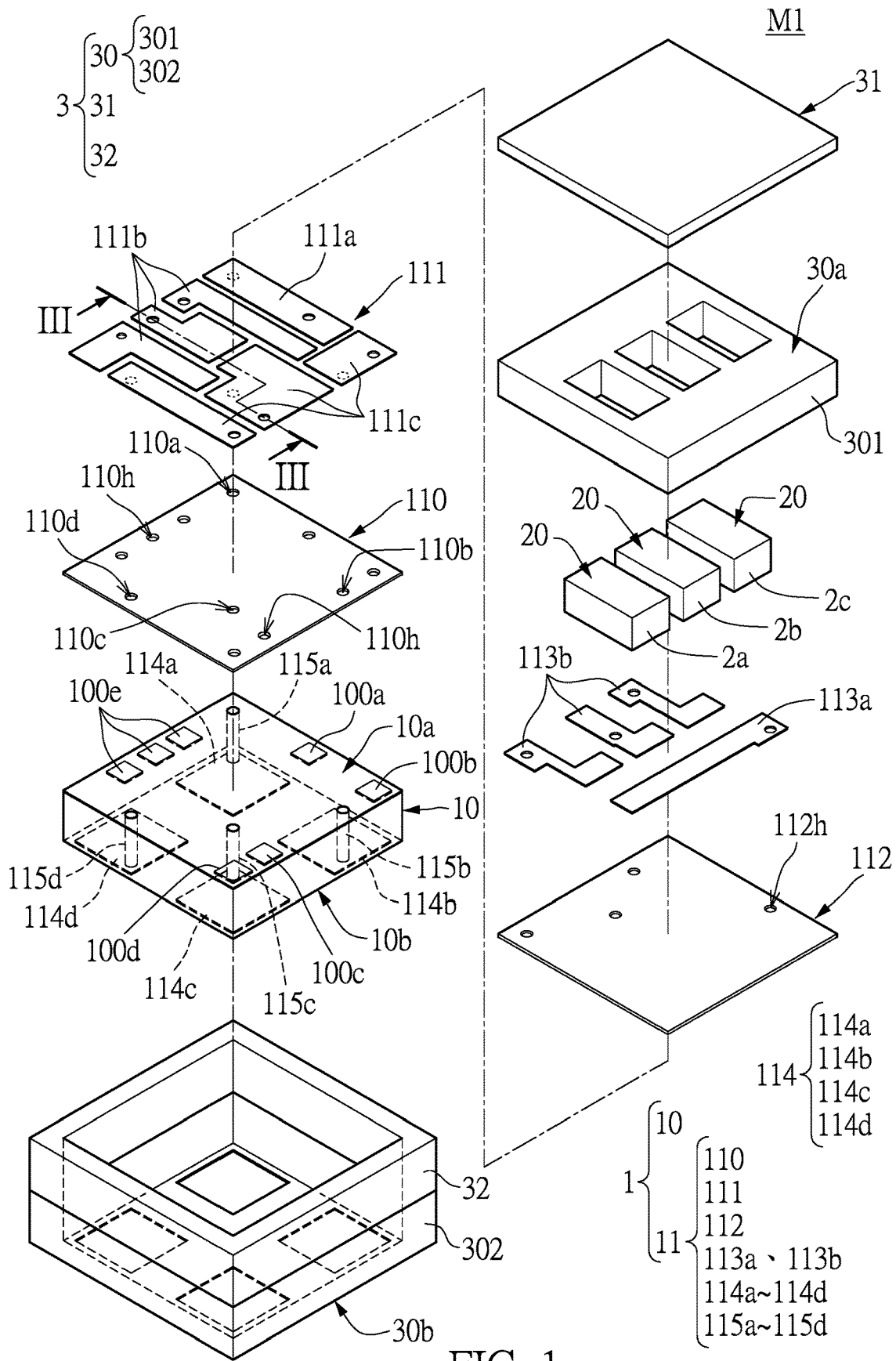
FIG. 1 is an exploded perspective view of a light-emitting package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
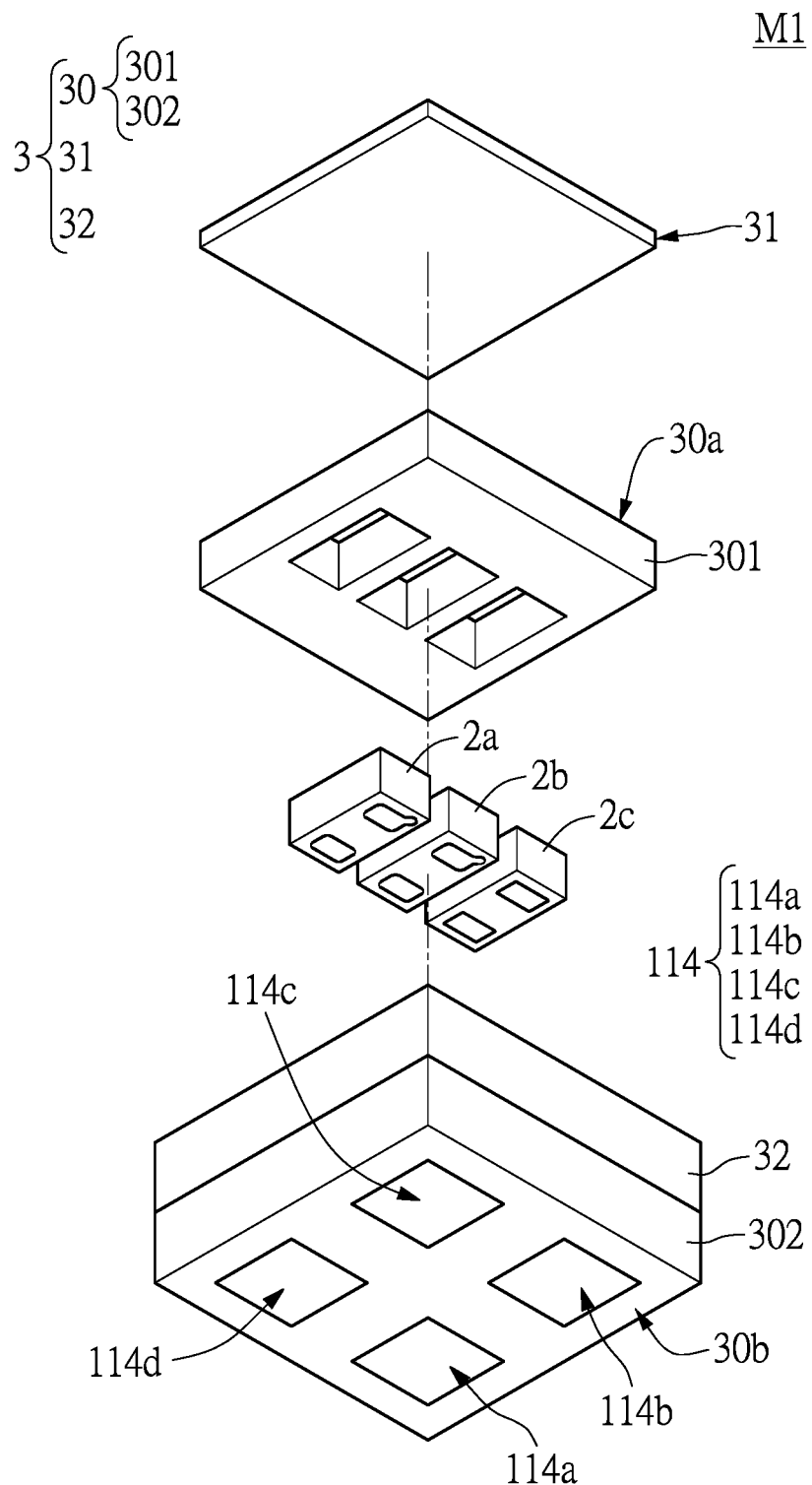
FIG. 2 is a perspective view of the light-emitting package structure from another angle according to the first embodiment of the present disclosure.
Figure 3:
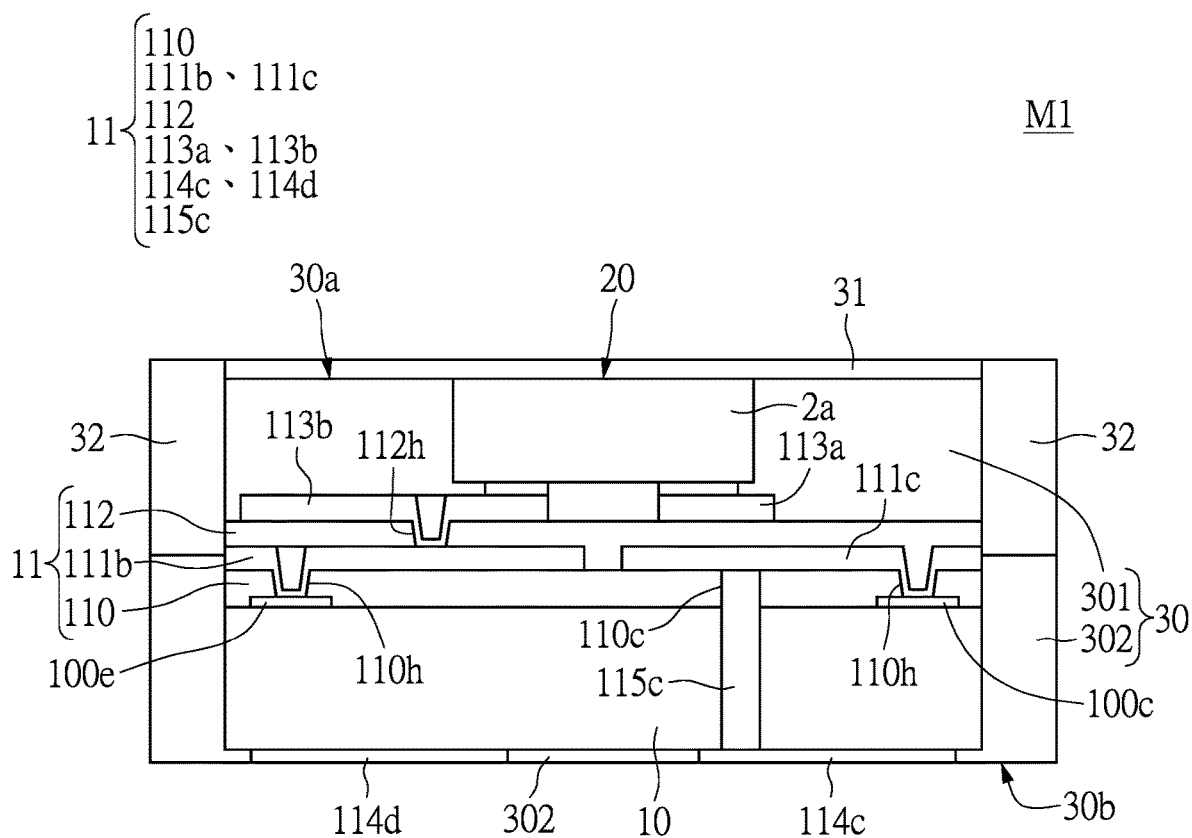
FIG. 3 is a cross-sectional view taken along line III-III of FIG. 1.

Reference is made to FIGS. 1-3. FIG. 1 is an exploded perspective view of a light-emitting package structure according to a first embodiment of the present disclosure. FIG. 2 is a perspective view of the light-emitting package structure from another angle according to the first embodiment of the present disclosure, and FIG. 3 is a cross-sectional view taken along line III-III of FIG. 1.

As shown in FIG. 1, in the instant embodiment, the light-emitting package structure M1 includes a driving device 1 and at least one light-emitting chip 2*a*, 2*b* or 2*c*. That is, the light-emitting package structure M1 may include one or more light-emitting chips. Moreover, the light-emitting package structure M1 of the instant embodiment can be a single-color light-emitting package structure, such as a light-emitting diode (LED), an infrared light-emitting diode, an ultraviolet diode, a laser diode, or a color mixing light-emitting diode, but the present disclosure is not limited thereto. It should be noted that in the instant embodiment, a plurality of light-emitting chips 2*a*-2*c* for generating different light beams with different wavelengths, such as red light, green light, or blue light, are only exemplified for description, and the present disclosure is not limited thereto.

In one embodiment, the driving device 1 is electrically connected to the light-emitting chips 2*a*-2*c* so as to output control signals to the light-emitting chips 2*a*-2*c*. Specifically, the driving device 1 can control currents that are respectively outputted to the light-emitting chips 2*a*-2*c* so as to adjust the brightness of light beams respectively generated by the light-emitting chips 2*a*-2*c*, so that the light-emitting package structure M1 can generate white lights with different color temperatures or the other color lights. In another embodiment, the light-emitting package structure M1 can include only one light-emitting chip 2*a*, 2*b*, or 2*c*, and the driving device 1 is used to control the current outputted to the light-emitting chip 2*a*, 2*b*, or 2*c* so as to adjust the brightness of the light-source of the light-emitting chip 2*a*, 2*b*, or 2*c*.

As shown in FIG. 1, the driving device 1 includes a driving chip 10 and a redistribution layer (RDL) structure 11 formed over the driving chip 10. Reference is made to FIG. 2, which is to be read in conjunction with FIG. 1. The driving chip 10 has a first surface 10*a* and a second surface 10*b* opposite to the first surface 10*a*. The driving chip 10 includes a plurality of contact pads 100*a*-100*e* located at the first surface 10*a* so that the driving chip 10 can be electrically connected to the light-emitting chips 2*a*-2*c* and an external circuit (not shown in FIG. 2).

The contact pads 100*a*-100*e* include a positive power supply voltage (Vdd) contact pad 100*a*, a data input (Din) contact pad 100*b*, a data output (Dout) contact pad 100*c*, a negative power supply voltage (Vss) contact pad 100*d*, and a plurality of current output contact pads respectively corresponding to the light-emitting chips 2*a*-2*c*. The number and functions of the contact pads 100*a*-100*e* can be configured according to a practical circuit design, and the present disclosure is not limited to the example provided herein.

In the present disclosure, a conventional package substrate is omitted in the light-emitting package structure M1. Instead, the redistribution layer structure 11 is directly formed over the driving chip 10 so that the driving chip 10 can be electrically connected to the light-emitting chips 2*a*-2*c*.

As shown in FIG. 1, the redistribution layer structure 11 includes a first dielectric layer 110, a patterned conductive interconnects 111, a second dielectric layer 112, a plurality of first conductive pads 113*a*, 113*b*, and a plurality of second conductive pads 114*a*-114*d*. The first dielectric layer 110, the patterned conductive interconnects 111, the second dielectric layer 112 and the first conductive pads 113*a*, 113*b* are sequentially disposed on the first surface 10*a* of the driving chip 10, and the second conductive pads 114*a*-114*d* are disposed on the second surface 10*b* of the driving chip 10.

Specifically, the first dielectric layer 110 is formed on the first surface 10a and has a plurality of first conductive through holes 110h, the positions of which respectively correspond to the positions of the contact pads 100a-100e. The patterned conductive interconnects 111 is disposed on the first dielectric layer 110 and electrically connected to the contact pads 100a-100e of the driving chip 10 respectively through the first conductive through holes 110h.

To be more specific, the patterned conductive interconnects 111 may, in some aspects, includes traces and/or conductive pads. In this embodiment, the patterned conductive interconnects 111 includes a first trace 111a, a plurality of second traces 111b, and a plurality of third traces 111c, which are spaced apart and insulated from one another. Furthermore, the traces 111a-111c are respectively connected to the contact pads 100a-100e respectively through the first conductive through holes 110h. In one embodiment, the traces 111a-111c can be formed by an electrochemical plating process containing a metal, such as platinum, gold, or nickel, or another conductive material, such as graphite, copper Cu, phosphorous doped copper (CuP), and platinum coated titanium (Pt/Ti), on the first dielectric layer 110. Preferably, any two adjacent ones of the traces 111a-111c are spaced apart from each other by a distance of at least 40 μm.

The numbers of the first trace 111a, the second traces 111b and the third traces 111c can be configured according to the number of the contact pads 100a-100e. Reference is made to FIG. 3, a portion of each of the traces (for example, the second traces 111b) extends into the corresponding first conductive through hole 110h so as to be electrically connected to the corresponding contact pad (for example, the current output contact pad 100e). Furthermore, the shape of each of the traces 111a-111c from the top view can be changed according to actual requirements, and the present disclosure is not limited to the examples provided herein.

In the instant embodiment, the first trace 111a is electrically connected to the positive power supply voltage contact pad 100a of the driving chip 10. Furthermore, the second traces 111b are electrically connected to the current output contact pads 100e for controlling the light-emitting chips 2a-2c. The number and the arrangements of the second traces 111b can be changed according to the number and the arrangements of the current output contact pad 100e. In the instant embodiment, there are three current output contact pads 100e; hence, the number of the second traces 111b is three, but the present disclosure is not limited thereto.

Reference is made to FIG. 1. The third traces 111c are electrically connected to the rest of the contact pads, i.e., contact pads 100b, 100c, and 100d. In one embodiment, the number of the third traces 111c is three, and these three third traces 111c are electrically connected to the data input (Din) contact pad 100b, the data output (Dout) contact pad 100c, and the negative power supply voltage (Vss) contact pad 100d, respectively.

The second dielectric layer 112 is formed on the patterned conductive interconnects 111 and includes a plurality of second conductive through holes 112h. The first conductive pads 113a, 113b can be formed on the second dielectric layer 112 by an electrochemical plating process containing a metal and electrically connected to the patterned conductive interconnects 111 respectively through the second conductive through holes 112h. In one embodiment, the number of the first conductive pads (113a, 113b) is less than the number of the traces 111a-111c. That is, only a portion of the traces 111a, 111b are electrically connected to the first conductive pads 113a, 113b through corresponding second conductive through holes 112h. Each of the light-emitting chips 2a-2c can be disposed on the first surface 10a of the driving chip 10 through the corresponding first conductive pads 113a, 113b and electrically connected to the driving chip 10. It should be noted that the numbers of the first conductive pads 113a, 113b and the traces 111a-111c can be determined according to an actual circuit design, and the present disclosure is not limited to the aforementioned example.

Furthermore, in the instant embodiment, the first conductive pad 113a can serve as a common anode pad to which all of anodes of the light-emitting chips 2a-2c are jointly and electrically connected, and the first conductive pad 113a is electrically connected to the positive power supply voltage contact pad 100a through the first trace 111a. The other first conductive pads 113b are electrically connected to cathodes of the light-emitting chips 2a-2c, respectively, and the first conductive pads 113b are electrically connected to the current output contact pads 100e, respectively, through the second traces 111b. It should be noted that the anodes and cathodes of the light-emitting chips 2a-2c can be arranged according to an actual circuit design, and the present disclosure is not limited to the aforementioned examples. In other words, the first conductive pad 113a can also serve as a common cathode pad for being electrically connected to all of the cathodes of the light-emitting chips 2a-2c, and the other first conductive pads 113b can be respectively connected to the anodes of the light-emitting chips 2a-2c.

Furthermore, referring to FIG. 2, the second conductive pads 114a-114d are disposed on the second surface 10b of the driving chip 10. That is to say, the first conductive pads 113a, 113b and the second conductive pads 114a-114d are respectively located at two opposite sides of the driving chip 10, and the light-emitting package structure M1 can be mounted on another circuit board (not shown in FIG. 2) through the second conductive pads 114a-114d. To be more specific, the light-emitting package structure M1 can be coupled to an external power source, and the external power source can drive the light-emitting chips 2a-2c through the driving device 1.

Specifically, referring to FIG. 1 and FIG. 2, in one embodiment, the first conductive pad 113a and the second conductive pad 114a that are electrically connected to each other are both electrically coupled to the first trace 111a. That is to say, the first conductive pad 113a serving as the common anode pad of the light-emitting chips 2a-2c is electrically coupled to the positive power supply voltage contact pad 100a through the first trace 111a, and the positive power supply voltage contact pad 100a is electrically connected to the corresponding second conductive pad 114a. When the light-emitting package structure M1 is mounted on a circuit board (not shown in FIG. 2) through the second conductive pads 114a-114d so as to be electrically coupled to an external power source, the light-emitting chips 2a-2c can be driven by the external power source through the driving device 1 to generate light beams.

It is worth mentioning that in the instant embodiment, the redistribution layer structure 11 further includes a plurality of conductive posts 115a-115d passing through the via holes of the driving chip 10 and the first dielectric layer 110. As shown in FIG. 1, the conductive post 115a passes through the driving chip 10 and a through via 110a of the first dielectric layer 110 and then extends to the first trace 111a. Similarly, the conductive posts 115b-115d pass through the driving chip 10 and the through vias 110b-110d of the first dielectric layer 110, respectively, and then extend to the third traces 111c.

It should be noted that each of the contact pads 100a-100d can be electrically connected to the corresponding one of the conductive posts 115a-115d through the corresponding one of the first wiring layer 111a and the third wiring layers 111c. Specifically, the positive power supply voltage (Vdd) contact pad 100a is electrically connected to the first wiring layer 111a, and the first wiring layer 111a is electrically connected to the corresponding second pad 114a through the corresponding conductive post 115a. Accordingly, the first pad 113a can be electrically connected to the corresponding second pad 114a.

Similarly, the data input (Din) contact pad 100b, the data output (Dout) contact pad 100c, and the negative power supply voltage (Vss) contact pad 100d can be electrically connected to the third traces 111c, respectively. The third traces 111c are electrically coupled to the other second conductive pads 114b-114c, respectively, through the conductive posts 115b-115d.

In other words, the second conductive pads 114b, 114c, 114d can be electrically coupled to the data input (Din) contact pad 100b, the data output (Dout) contact pad 100c, and the negative power supply voltage (Vss) contact pad 100d, respectively, through the conductive posts 115b, 115c, 115d, and the third traces 111c. Accordingly, each of the second conductive pads 114a-114d can be electrically coupled to the corresponding one of the contact pads 100a-100d.

Moreover, each of the other first conductive pads 113b is electrically connected to the corresponding one of the second traces 111b. As mentioned previously, the second traces 111b are electrically connected to the current output contact pads 100e. As such, the first conductive pads 113b are electrically coupled to the current output contact pads 100e, respectively.

Specifically, in the instant embodiment, a through-silicon via (TSV) technology is used for stacking and forming integrated circuits vertically so as to effectively shorten a conductive path length, thereby reducing on-resistance. Furthermore, the size of the chip can be reduced, such that the light-emitting package structure M1 has a smaller size, a higher integration and efficiency, and lower power consumption, and satisfies the requirements of lightweight and compact for digital electronic products.

Furthermore, as shown in FIG. 2, the second conductive pads 114a-114d jointly forms a patterned pad conducting layer 114. Reference is made to FIG. 1, which is to be read in conjunction with FIG. 2. In the embodiment of the present disclosure, a total area of the patterned pad conducting layer 114 is slightly greater than a total area of the patterned conductive interconnects 111. Preferably, a ratio of the total area of the patterned conductive interconnects 111 to the total area of the patterned pad conducting layer 114 is equal to or greater than 0.8. That is to say, a difference between the total areas of the patterned conductive interconnects 111 and the patterned pad conducting layer 114 is relatively low. For example, a ratio of the difference to the total area of the patterned conductive interconnects 111 (or to the total area of the patterned pad conducting layer 114) is not greater than 0.2.

It should be noted that since a thermal expansion coefficient of the patterned conductive interconnects 111 is different from those of the first and second dielectric layers 110, 112, the patterned conductive interconnects 111 may peel from the first or second dielectric layer 110, 112 caused by the thermal expansion difference. However, by decreasing the difference between the total areas of the patterned conductive interconnects 111 and the patterned pad conducting layer 114, the patterned conductive interconnects 111 can be prevented from peeling off of the first or second dielectric layer 110, 112.

Based on the mention above, when the light-emitting chips 2a-2c are disposed at the side where the first surface 10a is located, each of the light-emitting chips 2a-2c can be electrically coupled to the positive power supply voltage (Vdd) contact pad 100a and the corresponding one of the current output contact pads 100e through the corresponding first conductive pads 113a, 113b and the patterned conductive interconnects 111.

Reference is made to FIGS. 1-3. The light-emitting package structure M1 further includes a package body 3 surrounding the driving device 1 and the light-emitting chips 2a-2c. As shown in FIG. 2 and FIG. 3, the package body 3 includes an encapsulation layer 30, a light diffusion layer 31, and a reflective housing 32. The encapsulation layer 30 can be divided into an upper portion 301 and a lower portion 302, in which the encapsulation layer 30 can be made of a transparent material, such as transparent silicon. The lower portion 302 of the encapsulation layer 30 surrounds a side surface of the driving chip 10 and covers a portion of the second surface 10b, but the lower portion 302 exposes the outer surfaces of the second conductive pads 114a-114d. To be more specific, the second conductive pads 114a-114d are spaced apart from one another to form a gap, and a portion of the lower portion 302 of the encapsulation layer 30 is filled into the gap defined by any two adjacent ones of the second conductive pads 114a-114d.

Reference is made to FIGS. 2-3. In the instant embodiment, a bottom surface 30b of the encapsulation layer 30 does not overlap with the surfaces of the second conductive pads 114a-114d. Specifically, the bottom surface 30b of the encapsulation layer 30 is substantially flush with the surfaces of the second conductive pads 114a-114d. As such, when the light-emitting package structure M1 is mounted on a circuit board, since the bottom surface 30b of the encapsulation layer 30 is substantially flush with the surfaces of the second conductive pads 114a-114d, the problem of solder shorts, which may result in misalignment and lower yield while the light-emitting package structure is assembled to the circuit board, can be prevented, thereby improving an assembling yield.

Furthermore, the upper portion 301 of the encapsulation layer 30 covers the sidewalls of the light-emitting chips 2a-2c. In the instant embodiment, the upper portion 301 not only covers the sidewalls of the light-emitting chips 2a-2c, but also is filled into gaps defined by any two adjacent ones of the light-emitting chips 2a-2c. It should be noted that the upper portion 301 does not cover any one of light-emitting surfaces 20 of the light-emitting chips 2a-2c. In one embodiment, a top surface 30a of the encapsulation layer 30 is substantially flush with or proximate to the light-emitting surface 20a of at least one of the light-emitting chips 2a-2c.

The light diffusion layer 31 is disposed above the light-emitting surfaces 20 of the light-emitting chips 2a-2c. In the instant embodiment, since the top surface 30a of the encapsulation layer 30 is substantially flush with the light-emitting surfaces 20 of the light-emitting chips 2a-2c, all of the light-emitting surfaces 20 of the light-emitting chips 2a-2c and the top surface 30a of the encapsulation layer 30 are covered by the light diffusion layer 31. The light diffusion layer 31 can be made of transparent or semi-transparent silicone, in which the semi-transparent silicone can be made of transparent silicone doped with phosphor powders, titanium oxide, or silicon oxide. The light beams generated by the light-emitting chips 2a-2c can be mixed through the light diffusion layer 31, and then emit out from an outer surface of the light diffusion layer 31.

Furthermore, the reflective housing 32 is located adjacent to the encapsulation layer 30 and surrounds the light-emitting chips 2a-2c. Specifically, as shown in FIG. 3, a lateral surface of the upper portion 301 of the encapsulation layer 30 is longitudinally recessed or indented relative to a lateral surface of the lower portion 302 so as to form a platform. The reflective housing 32 is located on the platform (i.e., on the top surface of the lower portion 302) and surrounds the upper portion 301 of the encapsulation layer 30. In one embodiment, the material of the reflective housing 32 can be opaque and have a higher light reflectivity, such as a white silicone doped with titanium oxide or silicon oxide, so as to reflect the light beams generated by the light-emitting chips 2a-2c and adjust a beam angle (light-emitting angle) of the light emitted out of the light-emitting package structure M1.

Second Embodiment

Figure 4:
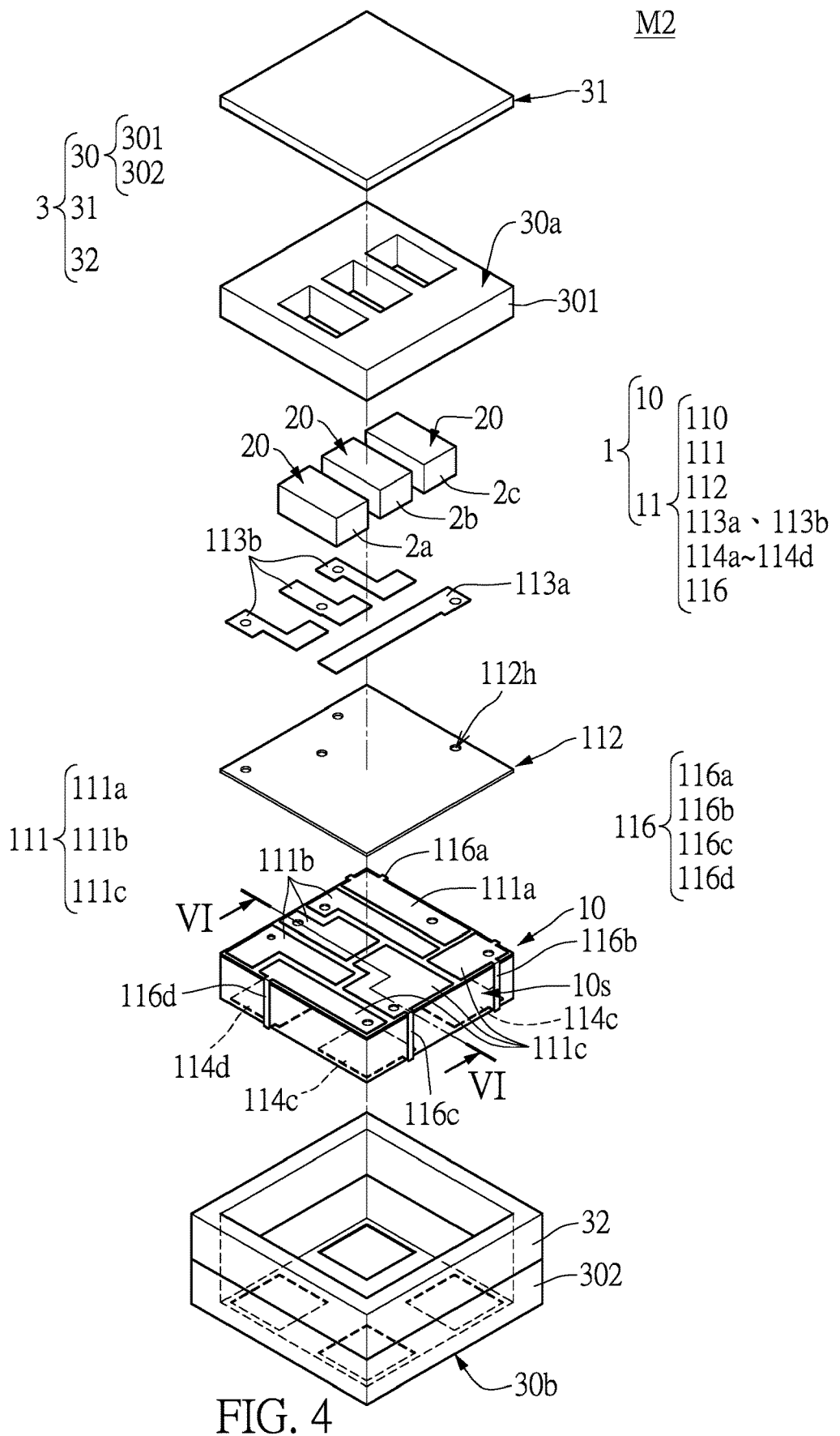
FIG. 4 is an exploded perspective view of a light-emitting package structure according to a second embodiment of the present disclosure.
Figure 5:
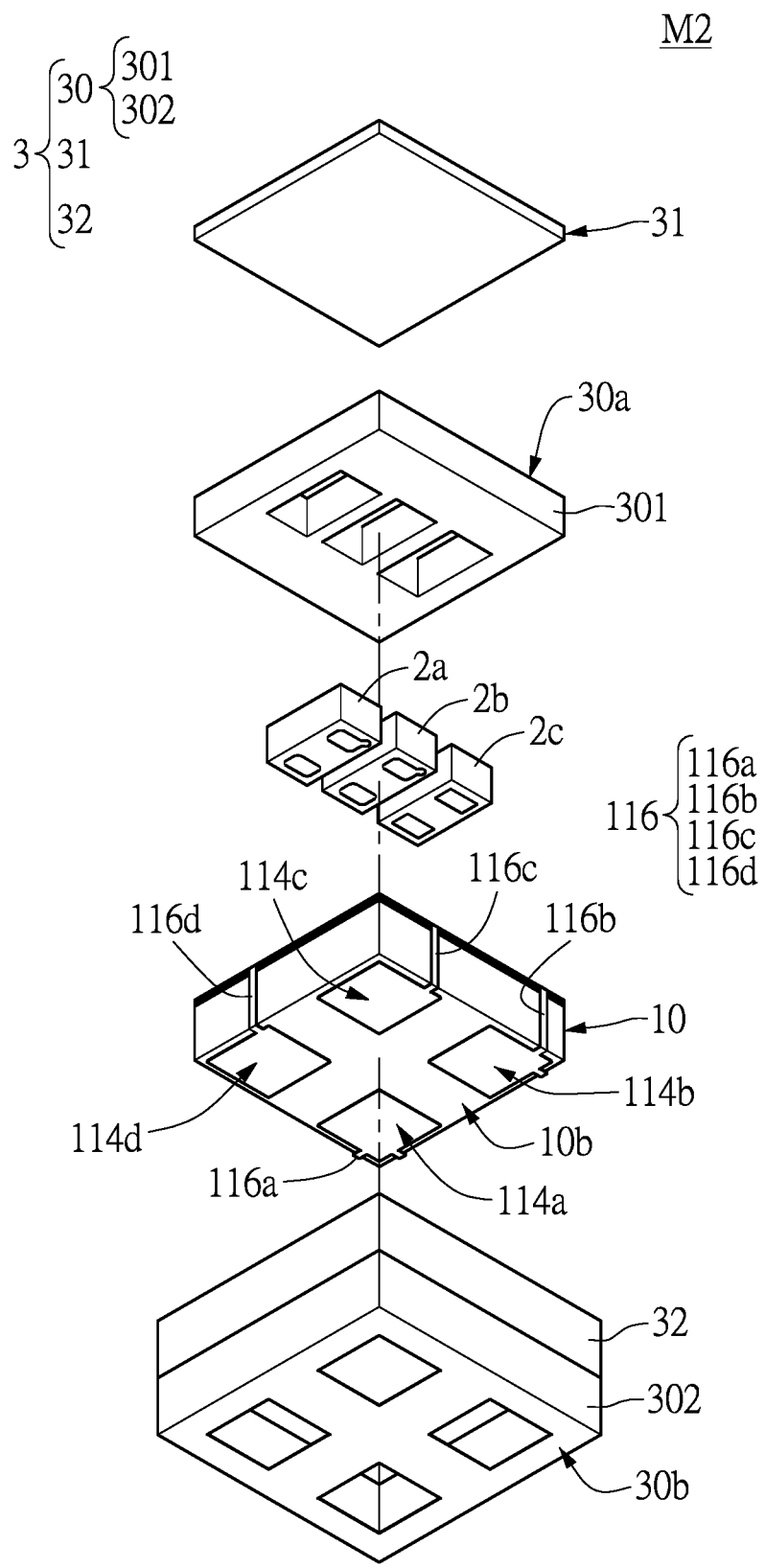
FIG. 5 is a perspective view of the light-emitting package structure from another angle according to the second embodiment of the present disclosure.
Figure 6:
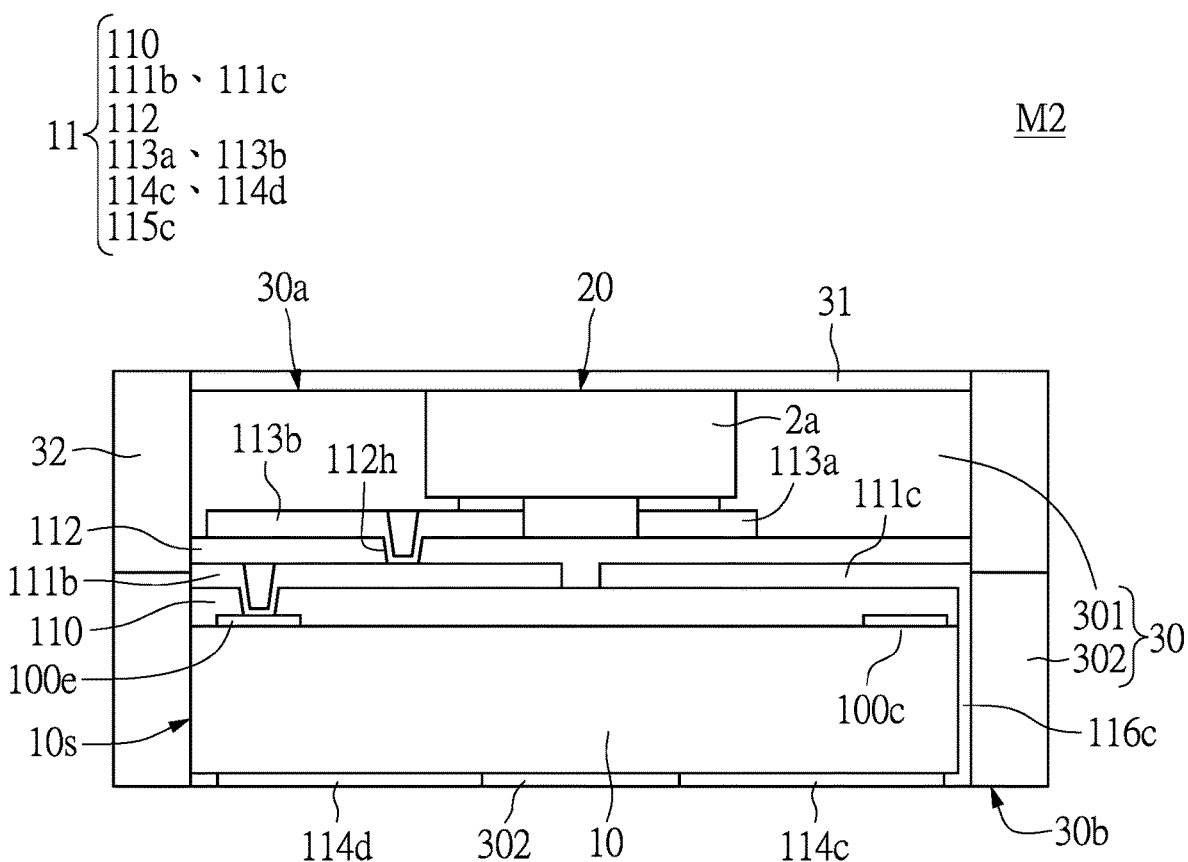
FIG. 6 is a cross-sectional view taken along line VI-VI of FIG. 4.

Referring to FIGS. 4-6, FIG. 4 is an exploded perspective view of a light-emitting package structure according to a second embodiment of the present disclosure, FIG. 5 is a perspective view of the light-emitting package structure from another angle according to the second embodiment of the present disclosure, and FIG. 6 is a cross-sectional view taken along line VI-VI of FIG. 4. The components in the light-emitting package structure M2 of the instant embodiment the same as those of the light-emitting package structure M1 are denoted by the same or similar reference numerals, and will not be reiterated herein.

In the light-emitting package structure M2 of the instant embodiment, the redistribution layer structure 11 further includes a lateral conductive trace 116 so that the patterned conductive interconnects 111 can be electrically connected to the second conductive pads 114a-114d. To be more specific, the lateral conductive trace 116 is formed on a sidewall 10s of the driving chip 10, and extends from the patterned conductive interconnects 111, which is located at the first surface 10a, toward the second surface 10b and then is connected to the second conductive pads 114a-114d at the second surface 10b.

To be more specific, the lateral conductive trace 116 includes a plurality of lateral conductive portions 116a-116d. Each of the lateral conductive portions 116a-116d is electrically connected between the corresponding one of the traces 111a-111c and the corresponding one of the second conductive pads 114a-114d. Accordingly, the first trace 111a is electrically connected to one of the second conductive pads 114a-114d (i.e., the second conductive pad 114a) through one (or more) of the lateral conductive portions 116a-116d (the lateral conductive portion 116a). Similarly, the third traces 111c can be electrically connected to the other second conductive pads 114b-114d, respectively, through the corresponding lateral conductive portions 116b-116d. That is to say, in the instant embodiment, a portion of the contact pads located at the first surface 10a of the driving chip 10, such as the positive power supply voltage contact pad 100a, the data input contact pad 100b, the data output contact pad 100c, and the negative power supply voltage contact pad 100d, are electrically connected to the second conductive pads 114a-114d, respectively, through the patterned conductive interconnects 111 and the lateral conductive trace 116 (that includes the lateral conductive portions 116a-116d).

Unlike the light-emitting package structure M1 of the first embodiment, it is not necessary for the light-emitting package structure M2 of the instant embodiment to form the conductive posts 115a-115d within the driving chip 10. Accordingly, the fabrication cost of the light-emitting package structure M2 in the instant embodiment is relatively lower.

Based on the above descriptions, in the light-emitting package structures M1, M2 of the embodiments in the present disclosure, the driving device 1 is used to support the light-emitting chips 2a-2c. Furthermore, by forming the redistribution layer structure 11 over the driving chip 10, two opposite surfaces of the driving device 1 can be respectively disposed with the first conductive pads 113a, 113b for being electrically connected to the light-emitting chips 2a-2c and the second conductive pads 114a-114d for being electrically connected to a circuit board. As such, the light-emitting package structures M1, M2 can be mounted on the circuit board through the second conductive pads 114a-114d located at the bottom thereof without using complex wire bonding process. Accordingly, the size of each light-emitting package structure M1 (or M2) can be reduced, and the reliability of an electronic apparatus using the light-emitting package structure M1 (or M2) can be improved.

Figure 7:
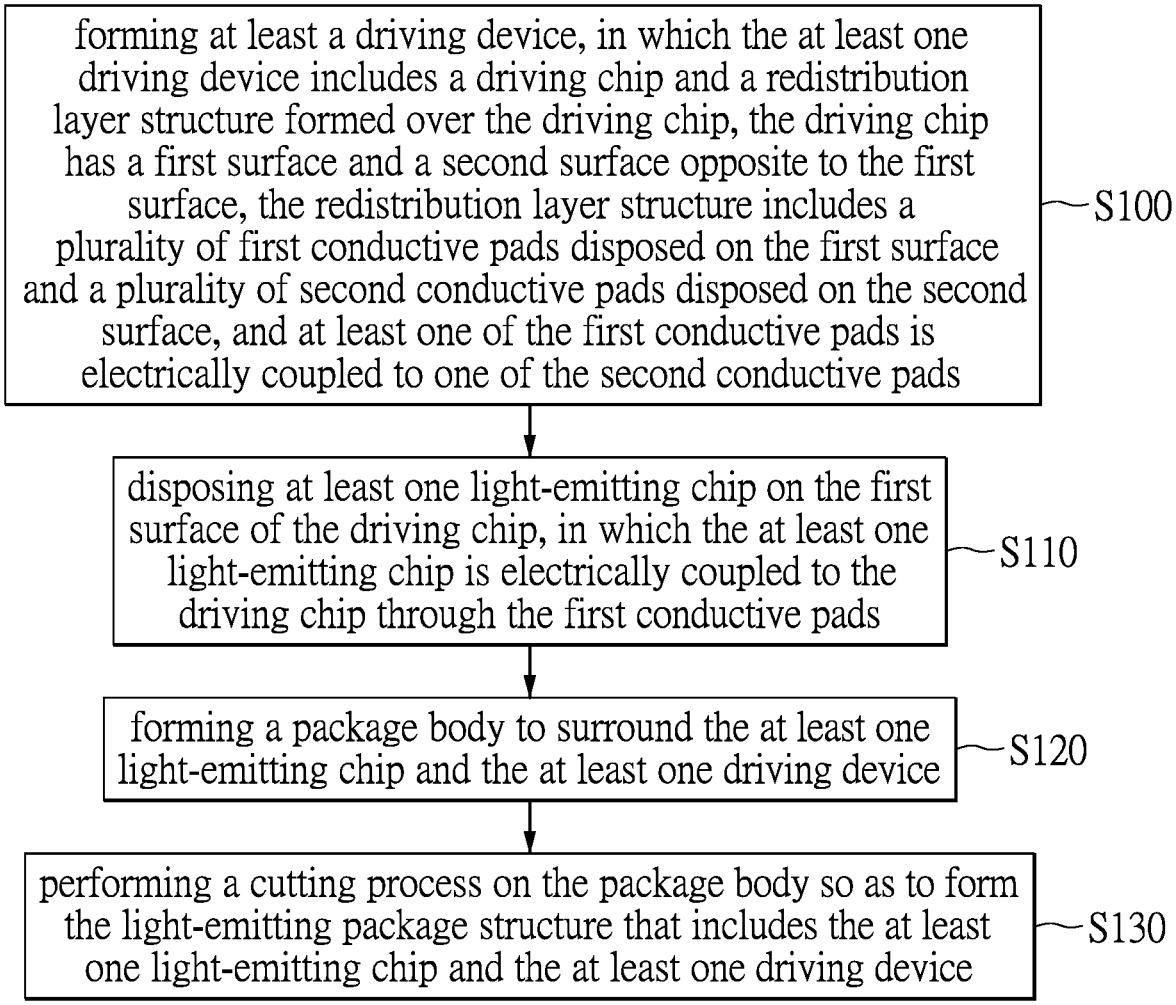
FIG. 7 is a flowchart of a manufacturing method of a light-emitting package structure according to an embodiment of the present disclosure.

Furthermore, a manufacturing method of a light-emitting package structure is provided in the present disclosure. The manufacturing method can be used to fabricate either the light-emitting package structure M1 of the first embodiment or the light-emitting package structure M2 of the second embodiment. Reference is made to FIG. 7, which is flow-chart of a manufacturing method of a light-emitting package structure according to an embodiment of the present disclosure.

In step S100, at least a driving device is formed, in which the at least one driving device includes a driving chip and a redistribution layer structure formed over the driving chip, the driving chip has a first surface and a second surface opposite to the first surface, the redistribution layer structure includes a plurality of first conductive pads disposed on the first surface and a plurality of second conductive pads disposed on the second surface, and at least one of the first conductive pads is electrically coupled to one of the second conductive pads.

In step S110, at least one light-emitting chip is disposed on the first surface of the driving chip, in which the at least one light-emitting chip is electrically coupled to the driving chip through the first conductive pads.

In step S120, a package body is formed to surround the at least one light-emitting chip and the at least one driving device.

In step S130, a cutting process is performed on the package body so as to form the light-emitting package structure that includes the at least one light-emitting chip and the at least one driving device.

Figure 8:
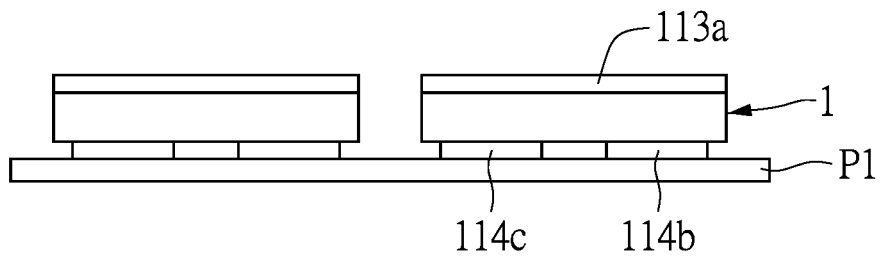
FIG. 8 is a partial sectional view of the light-emitting package structure in step S100 shown in FIG. 7 according to an embodiment of the present disclosure.

Reference is made to FIGS. 8-15, which respectively show partial sectional views of the light-emitting package structure in different steps according to an embodiment of the present disclosure. As shown in FIG. 8, a plurality of driving devices 1 are disposed on a temporary substrate, in which each of the driving devices 1 can be the driving device 1 of the first or second embodiment.

Accordingly, as shown in FIG. 3, each of the driving devices 1 includes a driving chip 10 and a redistribution layer structure 11. The driving chip 10 has the first surface 10a and the second surface 10b opposite to the first surface 10a. As mentioned previously, the redistribution layer structure 11 includes the first dielectric layer 110, the patterned conductive interconnects 111 and the second dielectric layer 112 which are sequentially disposed on the first surface 10a. Each of the first conductive pads 113a, 113b is electrically connected to the corresponding one of the contact pads 100a-100e of the driving chip 10.

The redistribution layer structure 11 further includes a plurality of second conductive pads 114a-114d disposed at the second surface 10b and a plurality of conductive posts 115a-115d (or a lateral conductive trace 116), so that each of the second conductive pads 114a-114d can be electrically connected to the corresponding one of the contact pads 100a-100d of the driving chip 10. One of the second conductive pads 114a114d (the second conductive pad 114a) is electrically coupled to one of the first conductive pads 113a, 113b (the first conductive pad 113a), and the other second conductive pads 114b-114d are electrically connected to the contact pads 100b-100d, respectively. In one embodiment, the fabrications of the driving chip 10 and the redistribution layer structure 11 shown in FIG. 1 and FIG. 4 can be completed during wafer-level processes, i.e., before the wafer is diced. Thereafter, a dicing process is performed on the wafer so as to divide the wafer into a plurality of individual driving devices 1.

Subsequently, as shown in FIG. 8, the individual driving devices 1 are arranged on the temporary substrate P1. It should be noted that only the first conductive pad 113a and the second conductive pads 114b, 114c of the redistribution layer structure 11 are illustrated in FIG. 8 to be exemplified for description, and the other parts are omitted. The first conductive pad 113a and the second conductive pads 114b, 114c are respectively located at two opposite surfaces of the driving device 1. When the driving devices 1 are disposed on the temporary substrate P1, any two adjacent ones of the driving devices 1 are spaced apart from each other by a predetermined distance, and each of the driving device 1 is arranged on the temporary substrate P1 with the second conductive pads 114b, 114c thereof facing toward the temporary substrate P1.

Figure 9:
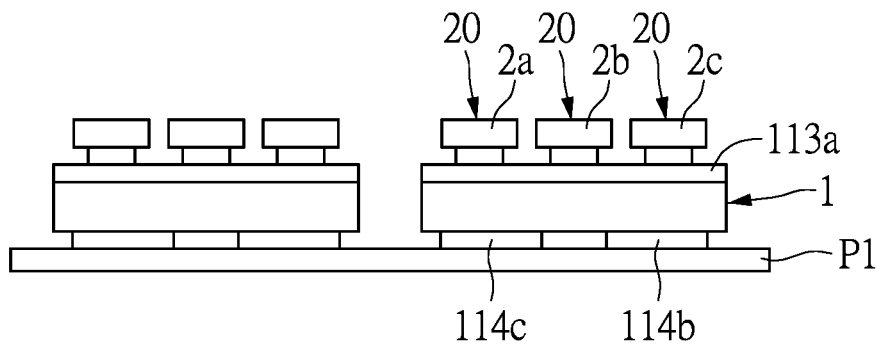
FIG. 9 is a partial sectional view of the light-emitting package structure in step S110 shown in FIG. 7 according to an embodiment of the present disclosure.

Reference is made to FIG. 9. At least one light-emitting chip 2a, 2b, 2c is disposed on each of the driving device 1. In the embodiment shown in FIG. 9, three light-emitting chips 2a-2c disposed on each of the driving device 1 are illustrated to be exemplified. Each of the light-emitting chips 2a-2c is disposed on the corresponding driving device 1 by soldering. That is, each of the light-emitting chips 2a-2c is disposed on the corresponding driving device 1 and electrically coupled to the driving chip 10 through the corresponding first conductive pads 113a, 113b.

Thereafter, the package body is formed to surround each of the light-emitting chips 2a-2c and each of the driving devices 1. Reference is made to FIGS. 10-14, which show detailed processes of forming the package body.

Figure 10:
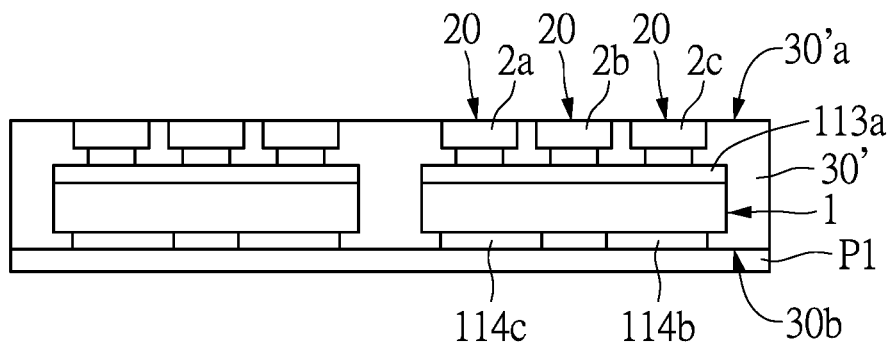
FIGS. 10 to 14 show partial sectional views is of the light-emitting package structure in each process in step S120 shown in FIG. 7 according to an embodiment of the present disclosure.

As shown in FIG. 10, an initial encapsulation layer 30' can be formed to encapsulate each of the driving devices 1 and each of the light-emitting chips 2a-2c. The light-emitting surface 20 of each of the light-emitting chips 2a-2c is exposed at the top surface 30'a of the initial encapsulation layer 30'. In other words, the initial encapsulation layer 30' does not completely cover the light-emitting surface 20 of each of the light-emitting chips 2a-2c. Furthermore, the light-emitting surface 20 of each of the light-emitting chips 2a-2c is substantially flush with the top surface 30'a of the initial encapsulation layer 30'.

In one embodiment, the initial encapsulation layer 30' can be formed by performing a hot-pressing process, in which an encapsulation material flows and is filled into a gap defined by any two adjacent ones of the driving devices 1 and the light-emitting chips 2a-2c. The encapsulation material would become flowable after being subjected to a thermal treatment and can be a semi-cured film (e.g., prepreg) or solid resin film. In the instant embodiment, the material of the initial encapsulation layer 30' is transparent silicone composition, but the present disclosure is not limited thereto. In another embodiment, the material of the initial encapsulation layer 30' can be epoxy resin.

Furthermore, it should be noted that during the formation of the initial encapsulation layer 30', the encapsulating material can also flow into a space between the second surface 10b of each driving chip 10 and the temporary substrate P1. That is to say, the initial encapsulation layer 30' is filled into a gap define by any two adjacent ones of the second conductive pads 114b, 114c. Accordingly, the bottom surface 30b of the initial encapsulation layer 30' is substantially flush with the surfaces of the second conductive pads 114b, 114c, which can prevent misalignment and lower yield that may result from a solder short during assembling.

Figure 11:
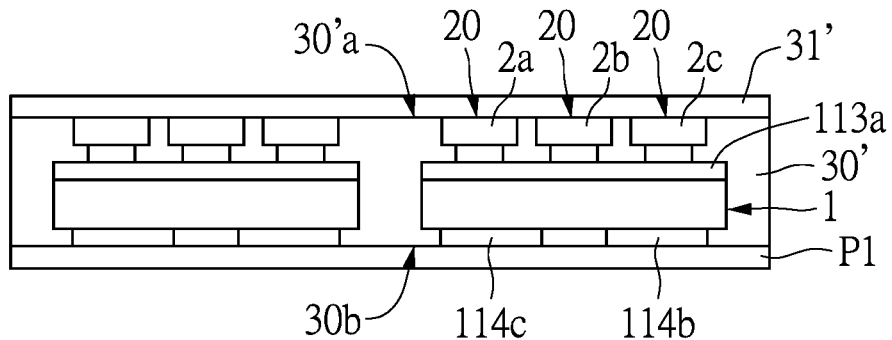

Reference is made to FIG. 11. An initial light diffusion layer 31' is disposed on the top surface 30'a of the initial encapsulation layer 30' so that the light beams can be mixed more uniform before the light beams emit out. The material of the initial light diffusion layer 31' may be transparent or semi-transparent. In one embodiment, the material of the initial light diffusion layer 31' can be transparent silicone doped with phosphor powders, titanium oxide, or silicon oxide. In the instant embodiment, since the light-emitting surfaces 20 of the light-emitting chips 2a-2c are exposed at the top surface 30'a of the initial encapsulation layer 30', the initial light diffusion layer 31' is in contact with both the top surface 30'a of the initial encapsulation layer 30' and the light-emitting surfaces 20 of the light-emitting chips 2a-2c.

Figure 12:
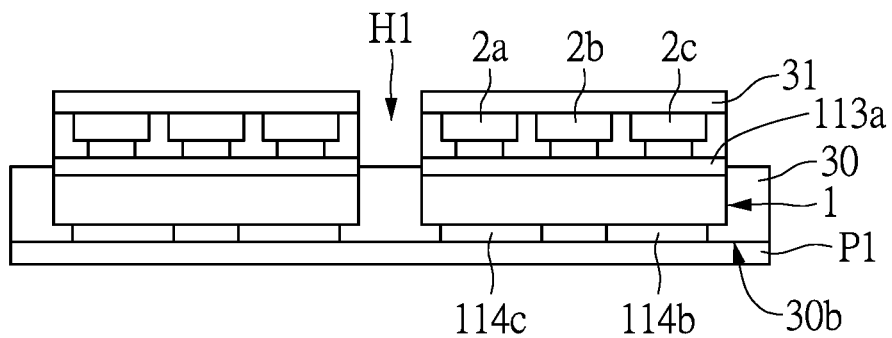

Reference is made to FIG. 12. A pre-cutting process is performed on the initial light diffusion layer 31' and the initial encapsulation layer 30' that are located at a periphery of each light-emitting package structure M1, M2 to form a plurality of trenches H1. Each of the trenches H1 surrounds the light-emitting chips 2a-2c and downwardly extends from an outer surface of the initial light diffusion layer 31' to the initial encapsulation layer 30' until the bottom end thereof reaches or beyond a level at which the surfaces of the first conductive pads 113a, 113b are located. That is to say, a depth of each trench H1 is equal to or greater than a sum of a thickness of each light-emitting chip 2a, 2b, 2c and a thickness of the initial light diffusion layer 31'.

Figure 13:
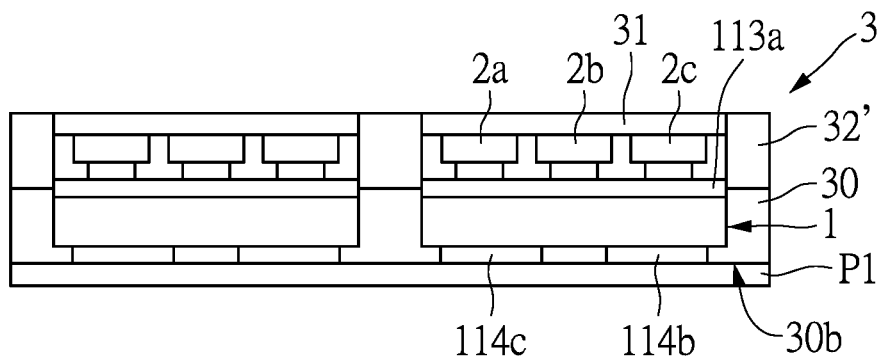

Reference is made to FIG. 13. A reflective material is filled into each of the trenches H1 so as to form an initial reflective housing 32' that surrounds the light-emitting chips 2a-2c. That is to say, a height of the initial reflective housing is equal to or greater than a sum of a thickness of each light-emitting chip 2a, 2b, 2c and a thickness of the initial light diffusion layer 31'. In one embodiment the initial reflective housing 32' can be formed from a silicone-based material by performing a hot-pressing process. The silicone-based material of the initial reflective housing 32' can be silicone doped with, such as titanium oxide, silicon oxide, aluminum oxide, zirconium oxide and the like, so as to reflect the light beams generated by the light-emitting chips 2a-2c and adjust the beam angle (light-emitting angle) of the light emitted out of the light-emitting package structure M1 (or M2). After the initial reflective housing 32' is formed, the fabrication of the package body 3 is completed.

Figure 14:
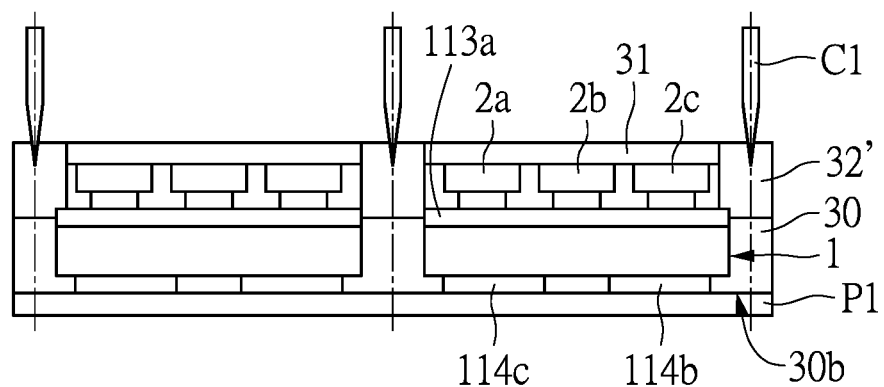
Figure 15:
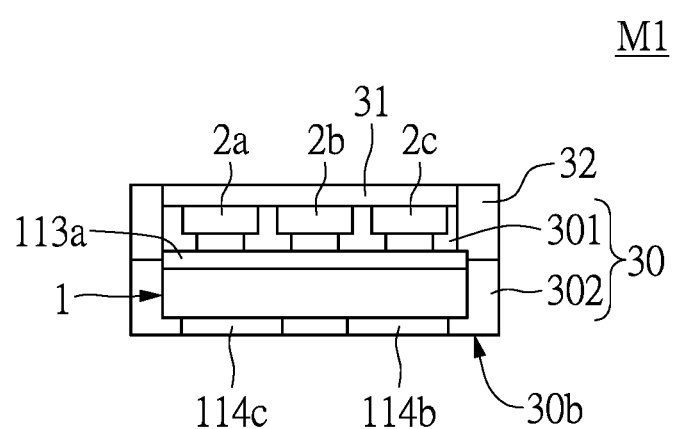
FIG. 15 is a partial sectional view of the light-emitting package structure in step S130 shown in FIG. 7 according to an embodiment of the present disclosure.

Thereafter, referring to FIGS. 14-15, a cutting process C1 is performed on the package body 3 so as to divide the package body 3 and form a plurality of light-emitting package structures M1 (or M2). Each of the light-emitting package structures M1 (or M2) includes at least one driving device 1 and at least one light-emitting chip 2a, 2b, 2c disposed thereon.

In conclusion, one of the advantages of the present disclosure is that in a light-emitting package structure and a manufacturing method thereof provided in the embodiments of the present disclosure, by the technical features of "the driving device 1 including the driving chip 10 and the redistribution layer structure 11 formed over the driving chip 10, in which the redistribution layer structure 11 includes the first conductive pads 113a, 113b on the first surface 10a and the second conductive pads 114a-114d on the second surface 10b, and one of the first conductive pads 113a, 113b, 113b is electrically connected to one of the second conductive pads 114a-114d" and "at least one light-emitting chip 2a, 2b, 2c being disposed on the first surface 10a of the driving chip 10 and electrically coupled to the driving chip 10 through the first conductive pads 113a, 113b," the light-emitting package structure M1 (or M2) with the LED electrically coupled to the driving chip 10 without the need for package substrate and wire bonds can be provided, so that the overall packaged size of the light-emitting package structure M1 (or M2) can be further reduced.

To be more specific, in the present disclosure, the driving device 1 including the redistribution layer structure 11 can be used to support the light-emitting chips 2a-2c and allow the light-emitting chips 2a-2c disposed thereon to be electrically connected to the driving chip 10 thereof. Furthermore, by applying a redistribution layer or through silicon via (TSV) technique in the fabrication of the driving device 1 to form a lateral conductive trace or conductive posts, the light-emitting chips 2a-2c can be electrically connected to the driving chip 10 in a direction normal to the conductive pads (the first and second conductive pads), so that the length of conductive paths configured between each of the light-emitting chips 2a-2c and the driving chip 10 can be reduced, thereby decreasing the length of the signal transmission path, reducing the capacitive coupling and improving overall performance of the electric circuit. Moreover, each light-emitting package structure M1, M2 has a smaller size, higher integrity and higher efficiency. Accordingly, compared to the conventional light-emitting diode package module in which a package substrate is used to support light-emitting chips and a driving chip, the size of the light-emitting package structure M1 (or M2) can be further scaled down so that the light-emitting package structure M1 (or M2) conforms to the aim of development toward a lightweight and compact design of the electronic products.

Moreover, compared to the conventional light-emitting diode package module in which the light-emitting chips and the driving chip are disposed on the same plane of the circuit board and arranged in a horizontal direction, in the light-emitting package structure M1 (or M2) provided in the present disclosure, the light-emitting chips 2a-2c are individually packaged and stack on the driving device 1. Accordingly, the light beams generated by the light-emitting chips 2a-2c can be more uniformly mixed without the interference of the driving chip 10 since the driving chip 10 is arranged beneath the light-emitting chips 2a-2c, instead of beside the light-emitting chips 2a-2c.

In addition, by arranging the second conductive pads 114a-114d at the bottom of the light-emitting package structure M1 (or M2), the light-emitting package structure M1 (or M2) can be directly mounted on a circuit board by a soldering process. Accordingly, the light-emitting package structure M1 (or M2) of the present disclosure can be mounted on the circuit board through the second conductive pads 114a-114d arranged at the bottom thereof without using a complex wire bonding process, thereby improving the reliability of an electronic apparatus.

On the other hand, when the light-emitting package structure M1 (or M2) includes a plurality of light-emitting chips 2a-2c, by using the light diffusion layer 31 and the reflective housing 32, the light beams generated by the light-emitting chips 2a-2c can be more uniformly mixed, and a beam angle (light-emitting angle) of the light emitted out of the light-emitting package structure M1 (or M2) can be modified.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting package structure, comprising:
a driving device including a driving chip and a redistribution layer structure formed over the driving chip, wherein the driving chip has a first surface and a second surface opposite to the first surface, the redistribution layer structure includes a plurality of first conductive pads disposed on the first surface and a plurality of second conductive pads disposed on the second surface, and at least one of the first conductive pads is electrically connected to one of the second conductive pads;
at least a light-emitting chip disposed over the first surface and electrically connected to the driving chip through the first conductive pads; and
a package body surrounding the driving device and the at least one light-emitting chip, wherein the package body covers a portion of the second surface and expose an outer surface of the second conductive pads.

2. The light-emitting package structure according to claim 1, wherein the driving chip further includes a plurality of contact pads, and the contact pads include a positive power supply voltage (Vdd) contact pad, a data input (Din) contact pad, a data output (Dout) contact pad, a negative power supply voltage (Vss) contact pad, and at least one current output contact pad.

3. The light-emitting package structure according to claim 2, wherein the redistribution layer structure includes a first dielectric layer and a patterned conductive interconnects, the first dielectric layer is disposed between the first surface and the patterned conductive interconnects and includes a plurality of first conductive through holes, and the patterned conductive interconnects is disposed on the first dielectric layer and electrically connected to the contact pads respectively through the first conductive through holes.

4. The light-emitting package structure according to claim 3, wherein the redistribution layer structure further includes a second dielectric layer disposed on the patterned conductive interconnects and including a plurality of second conductive through holes, and the first conductive pads are disposed on the second dielectric layer and electrically connected to the patterned conductive interconnects through the second conductive through holes, respectively.

5. The light-emitting package structure according to claim 4, wherein the patterned conductive interconnects includes a plurality of traces that are spaced apart from one another, the traces including:
 a first trace electrically connected to the positive power supply voltage contact pad, wherein the first trace is electrically connected to one of the first conductive pads and one of the second conductive pads;
 a second trace electrically connected to the at least one current output contact pad, wherein the second trace is electrically connected to another one of the first conductive pads; and
 a plurality of third traces respectively connected to the data input contact pad, the data output contact pad, and the negative power supply voltage contact pad, wherein at least one of the third traces is electrically connected to another one of the second conductive pads.

6. The light-emitting package structure according to claim 5, wherein the redistribution layer structure further includes a lateral conductive trace disposed at a sidewall of the driving chip, and the first trace and the third traces are respectively electrically connected to the one of the first conductive pads and the another one of the second conductive pads through the lateral conductive trace.

7. The light-emitting package structure according to claim 5, wherein the redistribution layer structure further includes a plurality of conductive posts passing through the driving chip, and the patterned conductive interconnects is electrically connected to the second conductive pads through the conductive posts.

8. The light-emitting package structure according to claim 1, wherein the redistribution layer structure includes a first dielectric layer and a patterned conductive interconnects, the first dielectric layer is disposed between the first surface and the patterned conductive interconnects, the second conductive pads jointly form a patterned pad conducting layer, and a total area of the patterned conductive interconnects is less than a total area of the patterned pad conducting layer.

9. The light-emitting package structure according to claim 1, wherein the light-emitting package structure is a color mixing light-emitting package structure and includes a plurality of light-emitting chips disposed on the first surface of the driving chip, and the light-emitting chips are electrically connected to the driving chip through the first conductive pads so as to generate different light beams with different wavelengths.

10. The light-emitting package structure according to claim 1, wherein the package body includes:
 an encapsulation layer surrounding the driving chip and a sidewall of at least one of the light-emitting chips, wherein a portion of the encapsulation layer is filled into a gap defined by any two adjacent ones of the second conductive pads, and another portion of the encapsulation layer surrounds the at least one of the light-emitting chips;
 a light diffusion layer disposed over the encapsulation layer and a light-emitting surface of the at least one light-emitting chip; and
 a reflective housing located between the encapsulation layer and the light diffusion layer, and surrounding the at least one light-emitting chip.

11. The light-emitting package structure according to claim 10, wherein a top surface of the encapsulation layer is substantially flush with or proximate to the light-emitting surface of the at least one light-emitting chip.

12. The light-emitting package structure according to claim 11, wherein a bottom surface of the encapsulation layer is substantially flush with the outer surface of each of the second conductive pads that is exposed from the package body.

13. The light-emitting package structure according to claim 12, wherein the encapsulation layer is made of a transparent material, the light diffusion layer is made of a transparent or semi-transparent material, and the reflective housing is made of opaque material having a higher light reflectivity.

14. The light-emitting package structure according to claim 13, wherein the light diffusion layer is silicone-based material that is doped with phosphor powders, the reflective housing is silicone-based material that is doped with titanium oxide or silicon oxide.

15. The light-emitting package structure according to claim 10, wherein the reflective housing has a height that is equal to or greater than a sum of a thickness of the at least one light-emitting chip and a thickness of the light diffusion layer.

16. A manufacturing method of the light-emitting package structure according to claim 1, comprising:
 forming at least one driving device, wherein the at least one driving device includes a driving chip and a redistribution layer structure formed over the driving chip, the driving chip has a first surface and a second surface opposite to the first surface, the redistribution layer structure includes a plurality of first conductive pads disposed on the first surface and a plurality of second conductive pads disposed on the second surface, and at least one of the first conductive pads is electrically connected to one of the second conductive pads;
 disposing at least one light-emitting chip on the first surface of the driving chip, wherein the at least one light-emitting chip is electrically connected to the driving chip through the first conductive pads;
 forming a package body to surround the at least one light-emitting chip and the at least one driving device; and
 performing a cutting process on the package body to form the light-emitting package structure that includes the at least one light-emitting chip and the at least one driving device.

17. The manufacturing method according to claim 16, wherein the step of forming the package body includes:
 forming an initial encapsulation layer surrounding the at least one driving device and the light-emitting chip, wherein a light-emitting surface of the at least one light-emitting chip is exposed at a top surface of the initial encapsulation layer;
 forming an initial light diffusion layer on the top surface of the initial encapsulation layer;
 performing a pre-cutting process on the initial light diffusion layer and the initial encapsulation layer to form a trench that surrounds the at least one light-emitting chip and downwardly extends from an outer surface of the initial light diffusion layer to the initial encapsulation layer; and
 filling a reflective material in the trench to form an initial reflective housing that surrounds a sidewall of the at least one light-emitting chip.

18. The manufacturing method according to claim 16, wherein after the step of forming the initial encapsulation layer, the initial encapsulation layer is filled in a gap defined by any two adjacent ones of the second conductive pads.

\* \* \* \* \*